United States Patent
Zheng et al.

(10) Patent No.: US 6,417,054 B1
(45) Date of Patent: Jul. 9, 2002

(54) METHOD FOR FABRICATING A SELF ALIGNED S/D CMOS DEVICE ON INSULATED LAYER BY FORMING A TRENCH ALONG THE STI AND FILL WITH OXIDE

(75) Inventors: Jia Zhen Zheng, Singapore (SG); Lap Chan, San Francisco, CA (US); Elgin Quek, Singapore (SG); Ravi Sundaresan, San Jose, CA (US); Yang Pan, Singapore (SG); James Yong Meng Lee, Singapore (SG); Ying Keung Leung, Hong Kong (HK); Yelehanka Ramachandramurthy Pradeep, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 14 days.

(21) Appl. No.: 09/769,830

(22) Filed: Jan. 26, 2001

(51) Int. Cl.[7] .............................................. H01L 21/366
(52) U.S. Cl. ...................................... 438/296; 438/300
(58) Field of Search ................................. 438/231, 296, 438/305, 300

(56) References Cited

U.S. PATENT DOCUMENTS

| 5,422,289 A | 6/1995 | Pierce ........................ 437/32 |
|---|---|---|
| 5,804,846 A | 9/1998 | Fuller ........................ 257/252 |
| 6,015,727 A | 1/2000 | Wanlass ...................... 438/218 |
| 6,071,783 A | * 6/2000 | Liang et al. ................. 438/301 |
| 6,211,026 B1 | * 4/2001 | Ahmad et al. ............... 438/300 |
| 6,306,712 B1 | * 10/2001 | Rodder et al. .............. 438/289 |

\* cited by examiner

*Primary Examiner*—Richard Booth
(74) *Attorney, Agent, or Firm*—George O. Saile; Rosemary L. S. Pike; William J. Stoffel

(57) ABSTRACT

A method for a self aligned TX with elevated source/drain (S/D) regions on an insulated layer (oxide) by forming a trench along side the STI and filling the trench with oxide. STI regions are formed in a substrate. A gate structure is formed. LDD regions are formed adjacent to the gate structure in the substrate. Spacers are formed on the sidewall of the gate structure. We etch S/D trenches between the STI regions and the first spacers. The S/D trenches are filled with a S/D insulating layer. Elevated S/D regions are formed over the S/D insulating layer and the LDD regions. A top isolation layer is formed over the STI regions. The invention builds the raised source/drain (S/D) regions on an insulating layer and reduces junction leakage and hot carrier degradation to gate oxide.

21 Claims, 4 Drawing Sheets

METHOD FOR FABRICATING A SELF ALIGNED S/D CMOS DEVICE ON INSULATED LAYER BY FORMING A TRENCH ALONG THE STI AND FILL WITH OXIDE

Background of Invention

1) Field of the Invention

This invention relates generally to fabrication of MOS semiconductor devicesland more particularly to the fabrication of a self aligned elevated S/D for a MOS Transistor.

2) Description of the Prior Art

As devices are scaled down, source/drain (S/D) formation needs to be improved in order to avoid junction leakage due to the shallow junction and the salicide formation.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,422,289 (Pierce) shows elevated S/D formed by CMP a poly layer.

U.S. Pat. No. 6,015,727 (Wanlass) shows a damascene process for Poly S/D contacts and Gate.

U.S. Pat. No. 5,804,846 (Fuller) teaches a method for a self aligned elevated S/D by W layer and CMP.

However, better isolation for elevated source/drain (S/D) regions is still required.

SUMMARY OF THE INVENTION

It is an object of the present invention to provide a method for fabricating a MOS transistor with elevated S/D regions that has reduced junction leakage.

It is an object of the present invention to provide a method for fabricating a MOS transistor with elevated S/D regions that are formed over an S/D insulating layer.

It is an object of the present invention to provide a method for fabricating a MOS transistor with elevated S/D regions that are salicided.

It is an object of the present invention to provide a method for fabricating a MOS transistor with elevated S/D regions that has improved hot carrier integrity.

To accomplish the above objectives, the present invention provides a method for a self aligned transitor with elevated S/D regions on an insulated oxide by forming a trench along side the STI and filling the trench with oxide. There are two preferred embodiment of the invention.

The method can be described as follows. STI regions are formed in a substrate. Next, we form a gate structure. The gate structure is preferably comprised of: a gate dielectric layer, a gate, and a hard mask. We then form LDD regions adjacent to the gate structure in the substrate. We form first spacers on the sidewall of the gate structure. We etch S/D trenches between the STI regions and the first spacers. The S/D trenches are filled with a S/D insulating layer.

The first and second preferred embodiment shows different method for performing the remaining steps. Next, we form elevated S/D regions over the S/D insulating layer and the LDD regions. We also, form a top isolation layer over the STI regions.

The invention has many advantages over the prior arts. The invention effectively isolated the raised source/drain (S/D) regions from the other elements and reduces junction leakage. The invention particularly improves junction leakage in Transistors with salicide processes as the salicide and silicon interface is placed away from the elevated S/D junction.

The invention reduces the hot carrier degradation to the gate oxide as the peak electric field is reduced.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 3A and 3B are cross sectional views for illustrating the beginning steps for the invention's method of forming a elevated S/D over a S/D insulating layer.

DETAILED DESCRIPTION OF THE PREFERRED EMBODIMENTS

A. First Preferred Embodiment—FIGS. 1 to 4B

The first preferred embodiment of the invention is shown in FIGS. 1 to 5. The steps shown in FIGS. 1 to 3A and 3B are common to both the first and second embodiments. The method can be described as follows.

Figure 1:
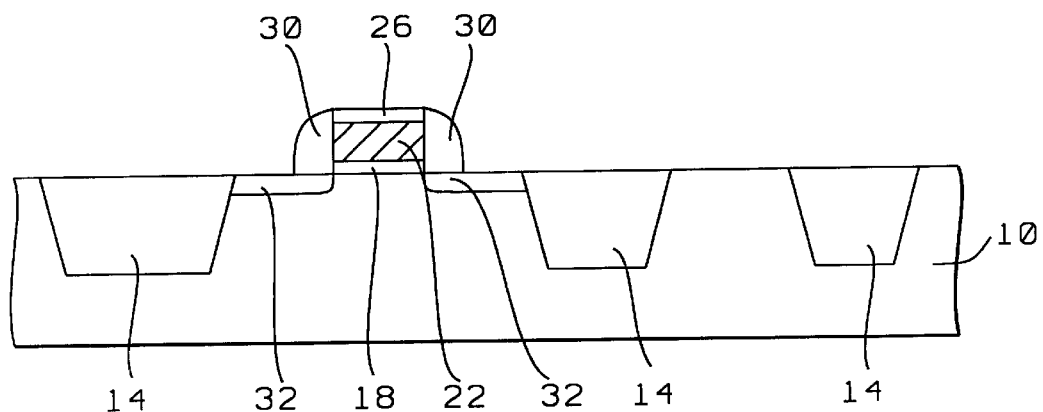

As shown in FIG. 1, STI regions are formed in a substrate 10.

Next, we form a gate structure. The gate structure is preferably comprised of: a gate dielectric layer 18, a gate 22, and a hard mask 26. The hard mask is preferably comprised of boron nitride, Silicon oxynitride, or SiN and is more preferably comprised of silicon nitride.

The gate is preferably comprised of polysilicon, polysilicon with a $WSi_x$ layer on top, polysilicon with Ti or TiN and is most preferably comprised of polysilicon with a $WSi_x$ layer on top.

We then form LDD regions 32 adjacent to the gate structure in the substrate 10.

Still referring to FIG. 1, we form first spacers 30 on the sidewall of the gate structure. The first spacers 30 preferably having a width of between about 500 and 5000 Å. The first spacer are preferably made of silicon nitride or silicon oxide.

Figure 2:
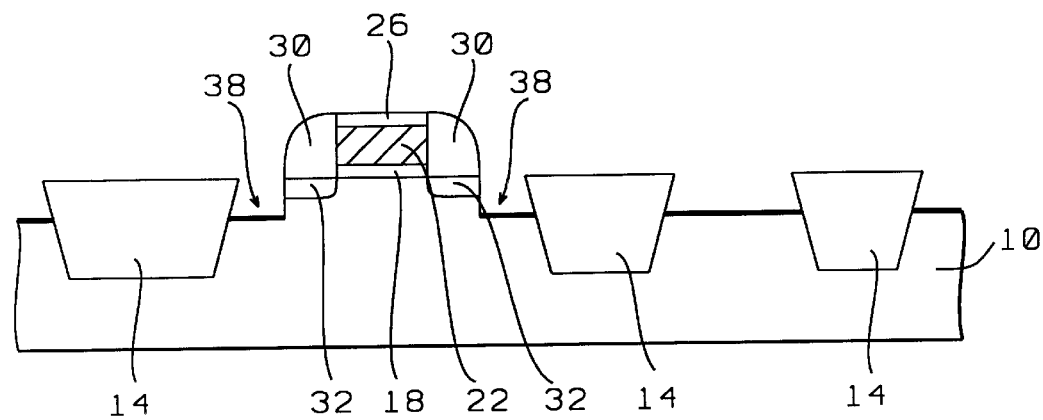

As shown in FIG. 2 we etch S/D trenches 38 between the STI regions and the first spacers 30 that are self aligned to the spacer and STI edge. No mask is required. The S/D trenches 38 preferably having a depth beneath the substrate surface between 200 and 2000 Å. The S/D trenches 38 preferably having a width between 0.05 and 0.5 μm.

Figure 3A:
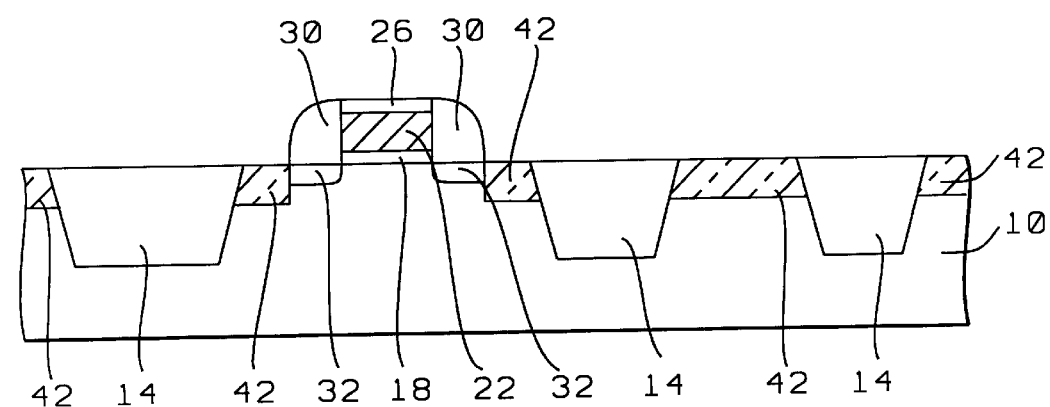

As shown in FIG. 3A the S/D trenches 38 are filled with a "S/D insulating layer" 42. The S/D insulating layer 42 can preferably be comprised of silicon oxide (formed by oxidation), or liquid phase epitaxy (LPE). The S/D insulating layer 42 is preferably comprised of oxide formed by oxidation with atomic oxygen generated by microwave power.

Next, we etch back the first spacers 30 to form thinner second spacers 46 and expose some of the surface of the LDD regions 48.

Figure 3B:
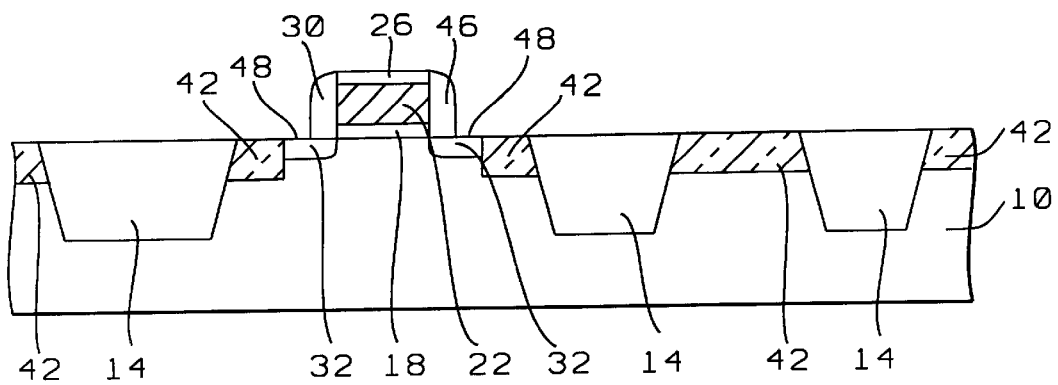

As shown in FIG. 3B, we form second spacers 30 on the sidewall of the gate structure. The second spacers 30 have a narrower width than the first spacers. The second spacers 46 have a width preferably of between about 200 and 2000 Å.

Next, we form a conductive layer (not shown) over the STI regions, S/D regions, the gate structure and the substrate. The conductive layer is preferably comprised of polysilicon or $Si_xGe_{1-x}$.

We planarize the conductive layer to a level of the hard mask. The planarizing of the conductive layer is preferably performed using chemical-mechanical polish (CMP).

Next, we etch back the conductive layer to a level below the top surface of the hard mask.

Figure 4:
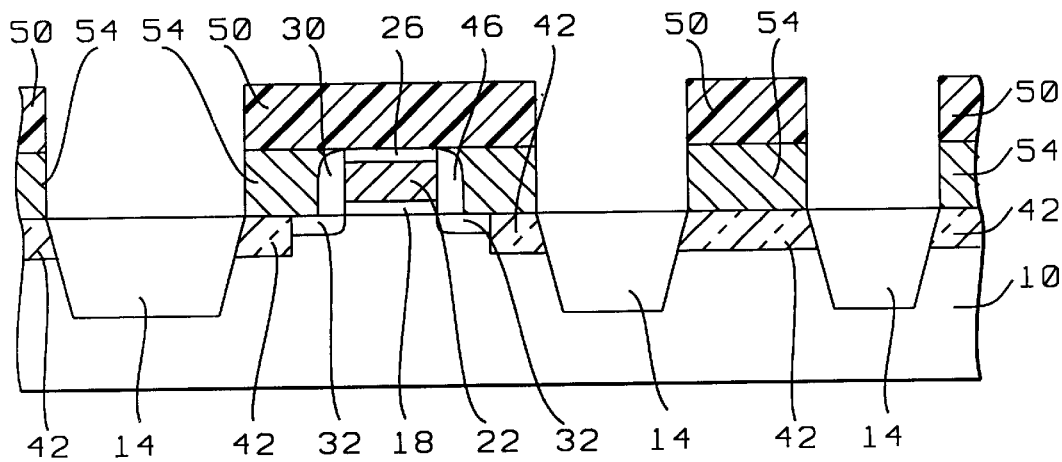
FIGS. 4 to 6 show cross sectional views for illustrating the final steps for the first preferred embodiment of invention's method of forming a S/D insulating layer under elevated S/D regions.

As shown in FIG. 4, we pattern the conductive layer using the mask 50 to form elevated S/D regions 54 over the S/D insulating layer 42 and the substrate adjacent to the second spacers.

The conductive layer is patterned to form elevated S/D regions 54 by an isolation mask 50 having opening over the STI regions 14 and etching the conductive layer using an isolation mask 50 as an etch mask. The mask 50 is then removed.

Figure 5A:
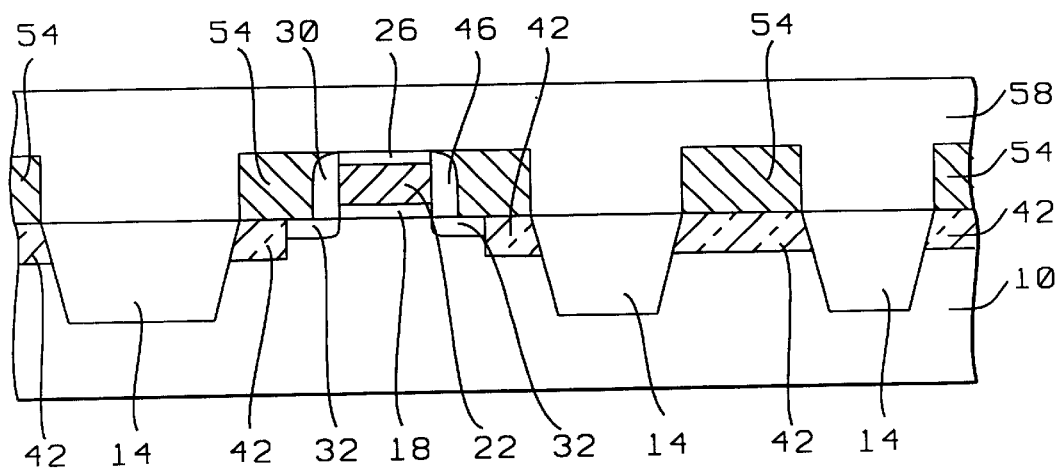

As shown in FIG. 5A, we form a dielectric layer 58 over the substrate 10. The dielectric layer preferably acts as an interlevel dielectric (IDL layer).

Figure 5B:
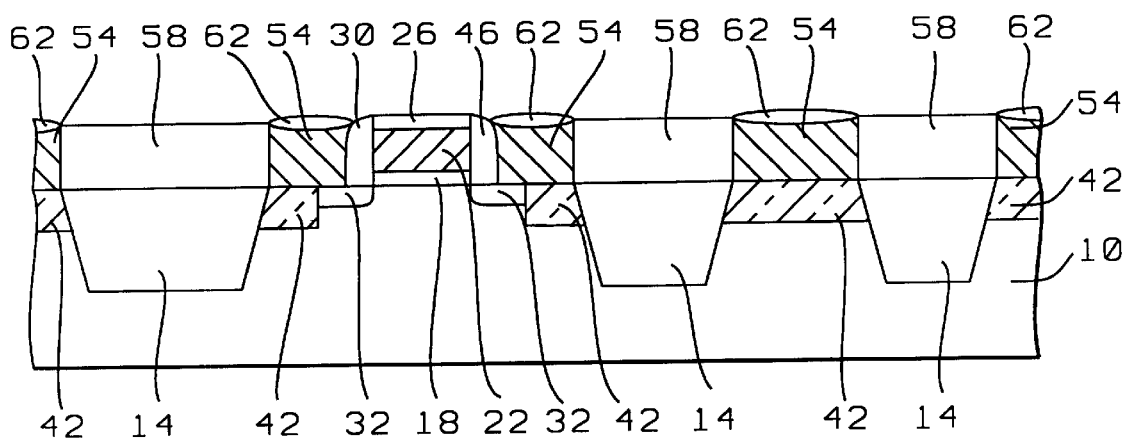

As shown in FIG. 5B, optionally, silicide regions 62 can be formed over the elevated S/D regions and the gate. The silicide regions can be $TiSi_2$, CoSi2 or NiSi.

B. Second Embodiment

The second preferred embodiment is shown in FIGS. 1 to 3B and FIG. 6 to 9.

The process is the same as first embodiment as shown in FIG. 1 to 3B and as described above. After the second spacers 46 are formed (See FIG. 3B), the second embodiment begins.

Figure 6:
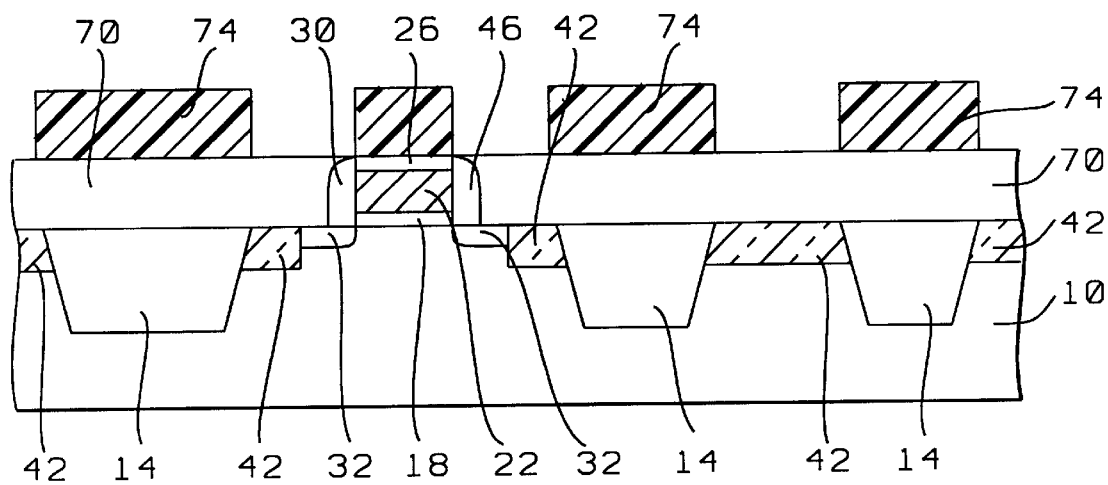

As shown in FIG. 6, we form a top isolation layer 70 over the substrate 10. The top isolation layer 70 is preferably composed of silicon oxide and preferably has a thickness of between about 1000 and 8000 Å.

As shown in FIG. 6, we planarize the top isolation layer 70 to the level of the hard mask. The planarization process is preferably a chemical-mechanical polish (CMP).

Next, a photoresist layer 74 is formed with opening over the source and drains.

Figure 7:
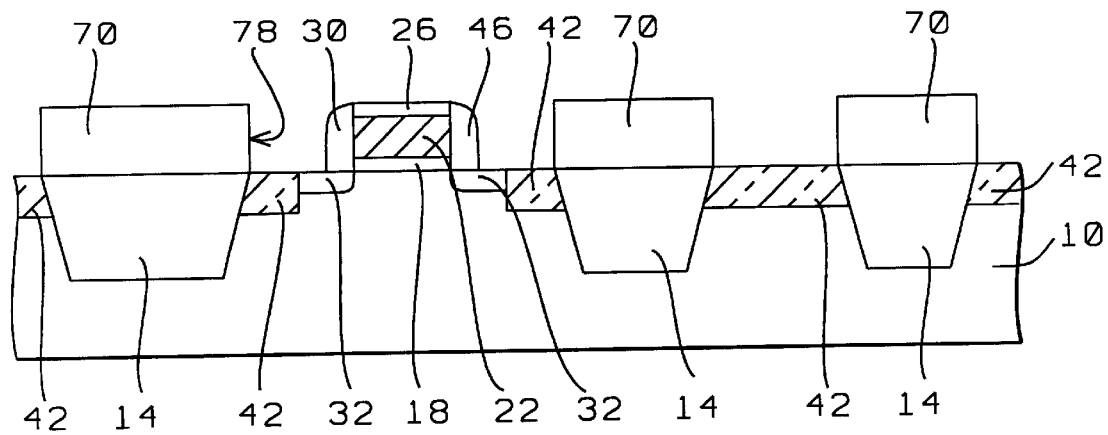
FIGS. 7 to 9 show cross sectional views for illustrating the final steps for the second preferred embodiment of invention's method of forming a S/D insulating layer under elevated S/D regions.

As shown in FIG. 7, next we pattern/etch the top isolation layer 70 through the openings in the resist 74 to form elevated S/D openings 78 over the S/D insulating layer 42 and the LDD regions 32. The photoresist layers is removed.

Figure 8:
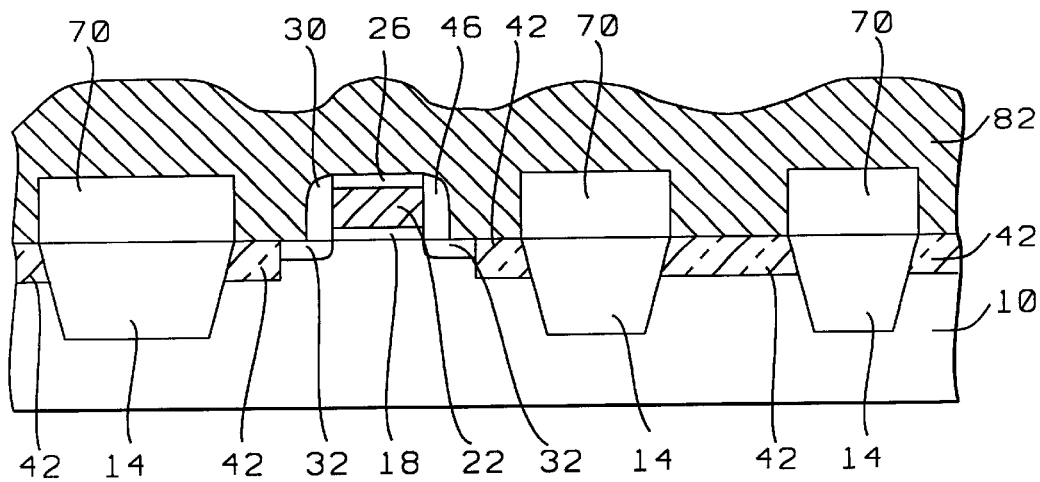

FIG. 8 shows the step of forming a conductive layer 82 over the substrate 10.

Figure 9:
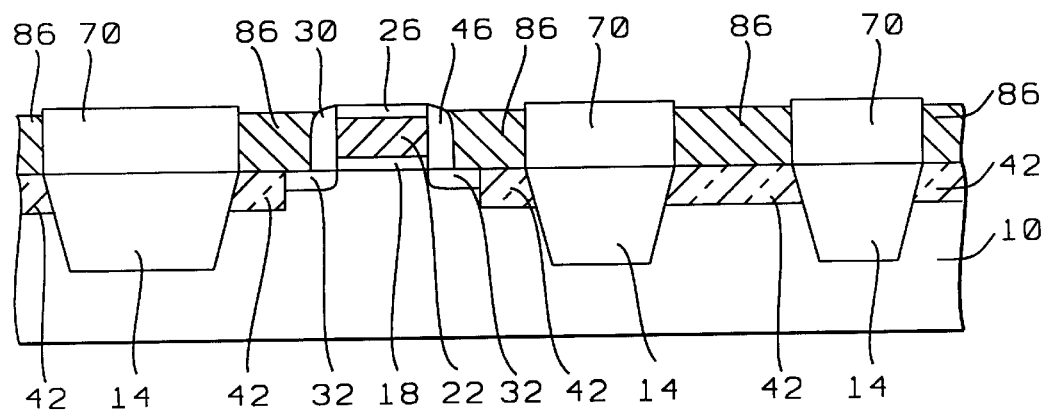

As shown in FIG. 9, we fill the elevated S/D openings 78 with elevated S/D regions 86. The filling of the elevated S/D openings 78 with elevated S/D regions 86 preferably comprises the steps of: (FIG. 8) (a) form a conductive layer 82 over the substrate 10, and (b) chemical-mechanical polish (CMP) the conductive layer 82 and etching back the elevated S/D regions 86 to a level below the top surface of the top isolation layer 70.

Optionally, as shown in FIG. 9, the elevated S/D regions 86 can be etched back to recess the top surface of the elevated S/D regions below the top isolation layer 70 surface.

Optionally, silicide regions 90 can be formed over the elevated S/D regions and the gate (for example, see FIG 5b).

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor.

Silicon, as used in this application, includes polysilicon (polycrystalline silicon), amorphous silicon (non-crystalline silicon), monocrystalline silicon and silicon/germanium materials. Such silicon may be n- or p-doped, or undoped.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of an elevated S/D for a MOS device; comprising the steps of:
   a) forming STI regions in a substrate;
   b) forming a gate structure comprised of: a gate dielectric layer (18), a gate, and a hard mask;
   c) forming LDD regions adjacent to said gate structure in said substrate;
   d) forming first spacers on the sidewall of said gate structure;
   e) etching S/D trenches between said STI regions and said first spacers;
   f) filling said S/D trenches with a S/D insulating layer;
   g) forming a conductive layer over said STI regions, said gate structure and said substrate;
   h) planarizing said conductive layer to a level of said hard mask;
   i) patterning said conductive layer to form elevated S/D regions over said S/D insulating layer and said substrate adjacent to said first spacers; and
   j) forming a dielectric layer over the substrate.

2. The method of claim 1 which further includes: planarizing said dielectric layer to the level of said hard mask; and forming silicide on said elevated S/D regions.

3. The method of claim 1 wherein said first spacers have a width of between about 500 and 5000 Å.

4. The method of claim 1 wherein said S/D trenches have a depth beneath the substrate surface between 200 and 2000 Å.

5. The method of claim 1 wherein said S/D trenches have a width between 0.05 and 0.5 µm.

6. The method of claim 1 wherein said S/D insulating layer is comprised of liquid phase epitaxy oxide or oxide by low temperature oxidation by atomic oxygen.

7. The method of claim 1 wherein said conductive layer is comprised of polysilicon or SiGe.

8. The method of claim 1 wherein the planarizing of said conductive layer is performed using chemical-mechanical polish (CMP).

9. The method of claim 1 wherein said conductive layer is patterned to form elevated S/D regions by forming an isolation mask having an opening over the STI regions and etching said conductive layer using an isolation mask as an etch mask.

10. The method of claim 1 wherein after step (f) and before step g) the following steps are performed: etching said first spacers to form second spacers on the sidewall of said gate structure.

11. The method of claim 1 wherein after step (f) and before step (g) the following steps are performed: removing said first spacers; and forming second spacers on the sidewall of said gate structure; and said second spacers have a narrower width than said first spacers and said second spacers have a width of between about 200 and 2000 Å.

12. A method of fabrication of an elevated S/D for a MOS device; comprising the steps of:
 a) forming STI regions in a substrate;
 b) forming a gate structure comprised of: a gate dielectric layer, a gate, and a hard mask;
 c) forming LDD regions adjacent to said gate structure in said substrate;
 d) forming first spacers on the sidewall of said gate structure;
  (1) said first spacers having a width of between about 500 and 5000 Å;
 e) etching S/D trenches between said STI regions and said first spacers;
  (1) said S/D trenches having a depth beneath the substrate surface between 200 and 2000 Å;
  (2) said S/D trenches having a width between 0.05 and 0.5 μm;
 f) filling said S/D trenches with a S/D insulating layer;
  (1) said S/D insulating layer comprised of liquid phase epitaxy oxide;
 g) etching said first spacers to form second spacers on the sidewall of said gate structure; said second spacers have a narrower width than said first spacers;
 h) forming a conductive layer over said STI regions, said gate structure and said substrate;
  (1) said conductive layer comprised of polysilicon;
 i) planarizing said conductive layer to a level of said hard mask;
  (1) the planarizing of said conductive layer performed using chemical-mechanical polish (CMP);
 j) etching back said conductive layer to a level of said hard mask to a level below said hard mask;
 k) patterning said conductive layer to form elevated S/D regions over said S/D insulating layer and said substrate adjacent to said second spacers;
  (1) said conductive layer is patterned to form elevated S/D regions by forming an isolation mask having an opening over the STI regions and etching said conductive layer using an isolation mask as an etch mask;
 l) forming a dielectric layer over the substrate; planarizing said dielectric layer to the level of said hard mask; and
 m) forming silicide on said elevated S/D regions.

13. A method of fabrication of an elevated S/D for a MOS device; comprising the steps of:
 a) forming STI regions in a substrate;
 b) forming a gate structure comprised of: a gate dielectric layer, a gate, and a hard mask;
 c) forming LDD regions adjacent to said gate structure in said substrate;
 d) forming first spacers on the sidewall of said gate structure;
 e) etching S/D trenches between said STI regions and said first spacers;
 f) filling said S/D trenches with a S/D insulating layer;
 g) etching back said first spacers to form second spacers on the sidewall of said gate structure;
 h) forming a top isolation layer over said substrate;
 i) planarizing said top isolation layer to the level of said hard mask;
 j) patterning said top isolation layer to form elevated S/D openings over said S/D insulating layer and said LDD regions;
 k) filling said elevated S/D openings with elevated S/D regions.

14. The method of claim 13 wherein said first spacers have a width of between about 500 and 5000 Å.

15. The method of claim 13 wherein said S/D trenches have a depth beneath the substrate surface between 200 and 2000 Å.

16. The method of claim 13 wherein said S/D trenches have a width between 0.05 and 0.5 μm.

17. The method of claim 13 wherein said S/D insulating layer is comprised of liquid phase epitaxy oxide.

18. The method of claim 13 wherein said second spacers have a narrower width than said first spacers.

19. The method of claim 13 wherein said second spacers have a width of between about 200 and 2000 Å.

20. The method of claim 13 wherein the filling of said elevated S/D openings with elevated S/D regions comprises the steps of: forming a conductive layer over said substrate; and chemical-mechanical polish (CMP) said conductive layer and etching back said elevated S/D regions to a level below the top surface of said top isolation layer.

21. A method of fabrication of an elevated S/D for a MOS device; comprising the steps of:
 a) forming STI regions in a substrate;
 b) forming a gate structure comprised of: a gate dielectric layer (18), a gate, and a hard mask;
 c) forming LDD regions adjacent to said gate structure in said substrate;
 d) forming first spacers on the sidewall of said gate structure;
  (1) said first spacers having a width of between about 500 and 5000 Å;
 e) etching S/D trenches between said STI regions and said first spacers;
  (1) said S/D trenches having a depth beneath the substrate surface between 200 and 2000 Å;
  (2) said S/D trenches having a width between 0.05 and 0.5 μm;

(3) said S/D trenches are etched by forming a S/D trench mask having an opening over the areas where said S/D trenches are to be formed and etching the substrate using the S/D trench mask as an etch mask;
f) filling said S/D trenches with a S/D insulating layer;
  (1) said S/D insulating layer comprised of liquid epitaxy oxide;
g) etching back said first spacers to form second spacers on the sidewall of said gate structure; said second spacers have a narrower width than said first spacers;
  (1) said second spacers have a width of between about 200 and 2000 Å;
h) forming a top isolation layer over said substrate;
i) planarizing said top isolation layer to the level of said hard mask;
j) patterning said top isolation layer to form elevated S/D openings over said S/D insulating layer and said LDD regions; and
k) filling said elevated S/D openings with elevated S/D regions;
  (1) the filling of said elevated S/D openings with elevated S/D regions comprises the steps of:
    forming a conductive layer over said substrate; and
    chemical-mechanical polish (CMP) said conductive layer and etching back said elevated S/D regions to a level below the top surface of said top isolation layer.

* * * * *